US009553714B2

(12) United States Patent
Ahmad et al.

(10) Patent No.: US 9,553,714 B2
(45) Date of Patent: Jan. 24, 2017

(54) FREQUENCY MULTIPLIER FOR A PHASE-LOCKED LOOP

(71) Applicant: Broadcom Corporation, Irvine, CA (US)

(72) Inventors: Fazil Ahmad, Irvine, CA (US); Pin-En Su, Irvine, CA (US); William Huff, San Diego, CA (US); Greg Unruh, San Clemente, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/871,202

(22) Filed: Sep. 30, 2015

(65) Prior Publication Data

US 2016/0380752 A1    Dec. 29, 2016

Related U.S. Application Data

(60) Provisional application No. 62/185,148, filed on Jun. 26, 2015.

(51) Int. Cl.
| | |
|---|---|
| *H03L 7/06* | (2006.01) |
| *H04L 7/00* | (2006.01) |
| *H04L 7/033* | (2006.01) |
| *H03L 7/099* | (2006.01) |
| *H03L 7/085* | (2006.01) |
| *H03L 7/18* | (2006.01) |

(52) U.S. Cl.
CPC ............ *H04L 7/0016* (2013.01); *H03L 7/085* (2013.01); *H03L 7/099* (2013.01); *H03L 7/18* (2013.01); *H04L 7/0054* (2013.01); *H04L 7/0331* (2013.01)

(58) Field of Classification Search
USPC .................................. 327/147–149, 156–158
See application file for complete search history.

(56) References Cited

U.S. PATENT DOCUMENTS

| | | | | |
|---|---|---|---|---|
| 5,420,545 | A * | 5/1995 | Davis ...................... | H03L 7/107 331/16 |
| 5,781,600 | A * | 7/1998 | Reeve ....................... | H03L 7/16 327/157 |
| 6,741,108 | B1 * | 5/2004 | Balardeta .................. | H03L 7/18 327/147 |
| 2004/0085103 | A1 * | 5/2004 | Ahn ....................... | H03L 7/1978 327/156 |

(Continued)

*Primary Examiner* — Adam Houston
(74) *Attorney, Agent, or Firm* — Sterne, Kessler, Goldstein & Fox P.L.L.C.

(57) ABSTRACT

The problem with duty-cycle correction circuits used by conventional frequency doublers is that they typically analog solutions, such as variable delay lines with long chains of inverters or buffers, that directly adjust the reference signal used by a phase-locked loop (PLL). These solutions can considerably increase the noise (e.g., thermal noise and supply noise) of the reference signal, as well as the overall power consumption and cost of the PLL. Rather than directly correct the duty-cycle of the reference signal, the present disclosure is directed to an apparatus and method for measuring the period error between adjacent cycles of a frequency doubled reference signal in terms of cycles of the output signal generated by the PLL (or some other higher frequency signal) and adjusting the division factor of the PLL frequency divider to compensate for the measured period error.

20 Claims, 7 Drawing Sheets

(56) References Cited

U.S. PATENT DOCUMENTS

2014/0340132 A1* 11/2014 Terrovitis ............... H03L 7/08
327/157
2015/0222276 A1* 8/2015 Milijevic ............... H03L 7/087
327/147

* cited by examiner

FREQUENCY MULTIPLIER FOR A PHASE-LOCKED LOOP

CROSS REFERENCE TO RELATED APPLICATIONS

This application claims the benefit of U.S. Provisional Patent Application No. 62/185,148, filed Jun. 26, 2015, which is incorporated herein by reference in its entirety.

TECHNICAL FIELD

This application relates generally to frequency multipliers, including frequency multipliers for phased-locked loops (PLLs).

BACKGROUND

A phase-locked loop (PLL) is used to establish and maintain a phase relationship between a generated output signal and an input reference signal. To provide such functionality, a PLL includes a variable frequency oscillator to generate the output signal and a phase detector to compare the phase of the output signal to the phase of the reference signal. Based on the comparison, the PLL adjusts the variable frequency oscillator to establish and maintain the phase relationship between the output signal and the reference signal. Once the phase relationship between the two signals becomes substantially constant in time (a result of which is that the input reference signal and the output signal frequencies are equal), the PLL is said to be "in lock."

Often, rather than comparing the phase of the output signal directly to the phase of the reference signal, a frequency divider is used to first reduce the frequency of the output signal by a division factor to generate a comparison signal. The phase detector then compares the phase of the comparison signal to the phase of the reference signal and any adjustment needed to the variable frequency oscillator is made based on this comparison. The use of a frequency divider results in the frequency of the output signal being generated with a frequency that is multiple times greater than the frequency of the reference signal by an amount equal to the division factor.

A PLL has several figures of merit that are used to characterize its performance. Often, one of the more important PLL figures of merit is output phase noise. All ideal PLL generates an output signal with a single tone at a desired frequency. For such an ideal PLL, the spectrum of the output signal assumes the shape of an impulse. In practice, phase noise is seen in the spectrum of the output signal as random fluctuations or "skirting" around the impulse. For many applications, phase noise in the output signal can have a negative impact on performance.

In communication systems that use a PLL output signal to down-convert a signal, this phase noise can corrupt the resulting frequency translated signal. For example, in a received signal, a desired channel centered at a frequency $\omega_0$ can be spaced very close to a strong undesired channel centered at a frequency $\omega_0 - \Delta_\Omega$. To down-convert the desired channel to baseband, the PLL can be configured to provide an output signal with a frequency equal to the center frequency $\omega_0$ of the desired channel, and the two signals can be mixed.

In the ideal ease, the PLL output signal consists of a single tone, with no phase noise, at the frequency $\omega_0$, and only the desired channel is down-converted to baseband. In practice, the PLL output signal includes phase noise around the single tone at $\omega_0$. This phase noise further mixes with the received signal and, if the bandwidth of the phase noise is larger than the distance separating the two channels (i.e., larger than $\Delta\omega$), the strong undesired channel will be down-converted to baseband where it will interfere with the desired channel and reduce the sensitivity of the communication system.

One way in which the phase noise of a can be reduced is by increasing the frequency of the reference signal. A higher frequency reference signal allows for a smaller division factor to be used by the frequency divider, As described above, the division factor has the effect of multiplying the frequency of the reference signal to produce the output signal at a higher frequency. In the process, the phase noise of the reference signal is also multiplied. Thus, even though the reference signal is typically generated by a crystal oscillator with low phase noise, high-levels of noise multiplication due to a large division factor can still cause the reference signal phase noise to degrade the phase noise of the output signal.

Increasing the frequency of the reference signal allows for a decrease in the division factor and a corresponding decrease in phase noise from the reference signal in the output signal. At the same time, a higher frequency reference signal enables a higher loop bandwidth, which can reduce phase noise contributions from the variable frequency oscillator of the PLL in the output signal. A higher frequency reference signal can also provide for a lower quantization noise from the PLL divider (e.g., from a PLL divider implemented using a sigma-delta modulator).

To achieve a higher frequency reference signal, a crystal oscillator that produces a reference signal at a higher frequency can be used, but such a solution is typically costly. Another approach is to use a frequency doubler to increase the frequency of the reference signal by a factor of two. Conventional methods of doubling the frequency of the reference signal rely on duty-cycle correction circuits to first correct the duty-cycle of the reference signal provided by a crystal oscillator to be 50%. The duty-cycle of a signal is the percentage of a cycle of the signal in which the signal is "active" or high. The problem with duty-cycle correction circuits is that they are typically analog solutions, such as variable delay lines with long chains of inverters or buffers, that directly adjust the reference signal. These solutions can considerably increase the noise (e.g., thermal noise and supply noise) of the reference signal, as well as the overall power consumption and cost of the PLL.

In general, a crystal oscillator provides a reference signal at a stable frequency and with low levels of phase noise but often with a duty cycle that is not 50%. The duty-cycle correction circuits are used because, without a 50% duty-cycle reference signal, a frequency doubler will typically produce a frequency doubled version of the reference signal with a constant duty-cycle variation and period variation between adjacent cycles. As a result of these variations, edges (either rising or falling) of the frequency doubled reference signal that are used as reference points by a PLL phase detector to measure phase error in the PLL output signal will deviate from their ideal positions and cause a periodic inaccuracy in the measured phase error.

Figure 1:
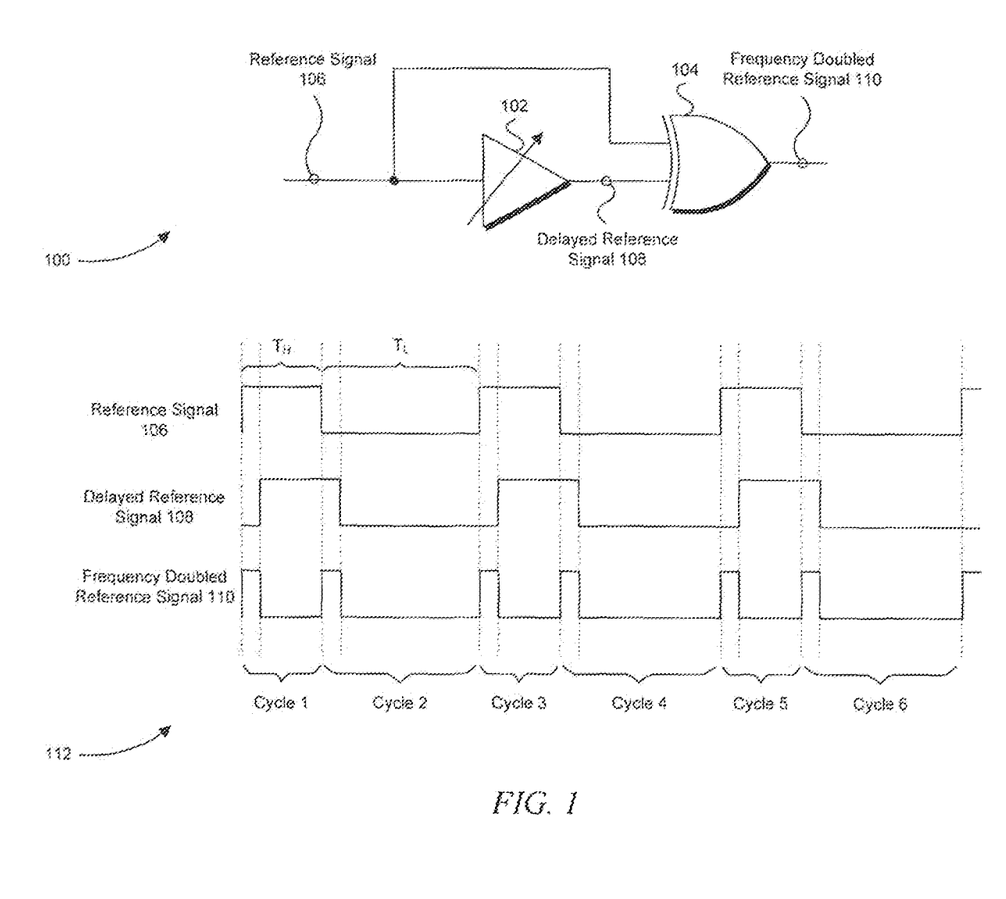
FIG. 1 illustrates a block diagram of a frequency doubler.

FIG. 1 illustrates an example frequency doubler 100 that can be used to double the frequency of a reference signal. As shown in FIG. 1, frequency doubler 100 includes a delay element 102 and an exclusive-OR gate 104. Delay element 102 is configured to delay a reference signal 106 with a stable frequency and low phase noise to produce a delayed reference signal 108. Exclusive-OR gate 104 is then configured to exclusive-OR the reference signal 106 and the delayed reference signal 108 to produce a reference signal 110 with double the frequency of reference signal 106.

A waveform diagram 112 is further provided in FIG. 1 to illustrate the operation of frequency doubler 100 when reference signal 106 does not have a 50% duty-cycle (i.e., $T_H/T_H+T_L)\neq 0.5$). As can be seen from waveform diagram 112, when reference signal 106 does not have a 50% duty-cycle, frequency doubler 100 produces frequency doubled reference signal 110 with a constant duty-cycle variation and period variation between adjacent cycles. More specifically, between adjacent cycles 1 and 2 in frequency doubled reference signal 110, there is an apparent duty-cycle variation and period variation. This same duty-cycle variation and period variation also occurs between all other subsequent adjacent cycles, including cycles 3 and 4 and cycles 5 and 6 shown in waveform diagram 112.

BRIEF DESCRIPTION OF THE DRAWINGS/FIGURES

The accompanying drawings, which are incorporated herein and form a part of the specification, illustrate the present disclosure and, together with the description, further serve to explain the principles of the disclosure and to enable a person skilled in the pertinent art to make and use the disclosure.

The present disclosure will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the disclosure. However, it will be apparent to those skilled in the art that the disclosure, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that is within the knowledge of one skilled in the art to affect such feature, structure, or characteristic in connection with other embodiments whether or not explicitly described.

For purposes of this discussion, the term "module" shall be understood to include software, firmware, or hardware (such as one or more circuits, microchips, processors, and/or devices), or any combination thereof. In addition, it will be understood that each module can include one, or more than one, component within an actual device, and each component that forms a part of the described module can function either cooperatively or independently of any other component forming a part of the module. Conversely, multiple modules described herein can represent a single component within an actual device. Further, components within a module can be in a single device or distributed among multiple devices in a wired or wireless manner.

1. Overview

As discussed above, a conventional frequency doubler uses a duty-cycle correction circuit to correct the duty-cycle of a reference signal to be 50% before doubling the frequency of the reference signal. The duty-cycle correction circuit is used because, without a 50% duty-cycle reference signal, a frequency doubler will typically produce a frequency doubled version of the reference signal with a constant duty-cycle variation and period variation between adjacent cycles. As a result of these variations, edges (either rising or falling) of the frequency doubled reference signal that are used as reference points by a PLL phase detector to measure phase error in the PLL output signal will deviate from their ideal positions and cause a periodic inaccuracy in the measured phase error.

The problem with duty-cycle correction circuits used by conventional frequency doublers is that they are typically analog solutions, such as variable delay lines with long chains of inverters or buffers, that directly adjust the reference signal. These solutions can considerably increase the noise (e.g., thermal noise and supply noise) of the reference signal, as well as the overall power consumption and cost of the PLL.

Rather than directly correct the duty-cycle of the reference signal, the present disclosure is directed to an apparatus and method for measuring the period error between adjacent cycles of a frequency doubled reference signal in terms of cycles of the output signal generated by the PLL (or some other higher frequency signal) and adjusting the division factor of the PLL divider to compensate for the measured period error.

In one embodiment, the apparatus and method of the present disclosure use one or more counters to count the number of cycles of the output signal that occur during each cycle of two adjacent cycles of the frequency doubled reference signal or, alternatively, the number of cycles of the output signal that occur during each of the high and low portions of a cycle of the reference signal. One-half the difference between the count values is used as a measure of the period error between adjacent cycles of the frequency doubled reference signal.

In another embodiment, the apparatus and method of the present disclosure integrates a sequence of one-bit values (after they have been normalized as explained further below) that each indicate whether a cycle of the frequency doubled reference signal leads or lags a corresponding cycle of the output signal after the output signal has been reduced in frequency by the PLL frequency divider. The integrated value is used as a measure of the period error between adjacent cycles of the frequency doubled reference signal in terms of cycles of the output signal.

Before further describing these and other features of the present disclosure, an exemplary operating environment in which embodiments of the present disclosure can be implemented is provided in the following section.

2. Exemplary Operating Environment

Figure 2:
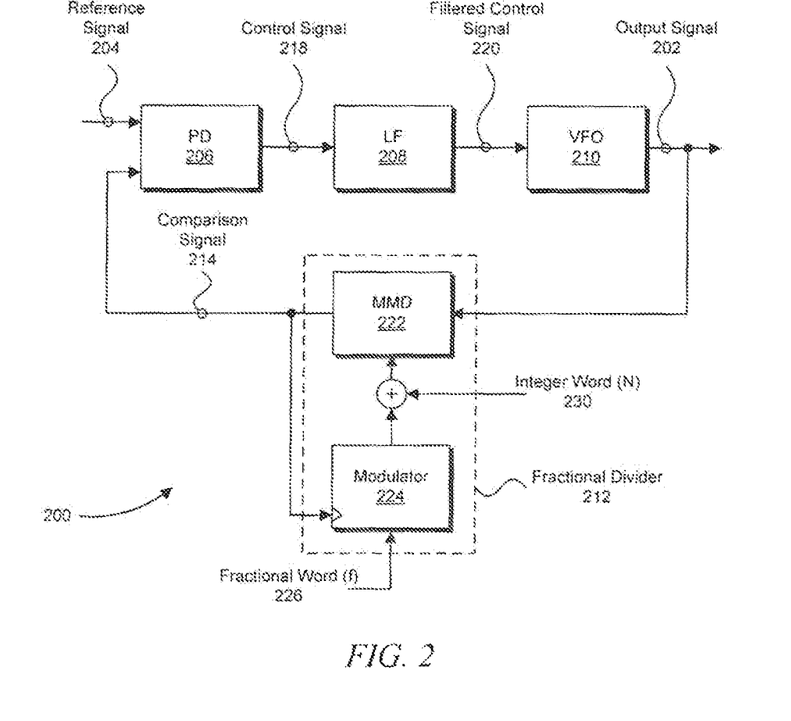
FIG. 2 illustrates a block diagram of an example PLL.

FIG. 2 illustrates an example PLL 200 in which embodiments of the present disclosure can be implemented. In general, PLL 200 is used to generate an output signal 202 having a desired output frequency from a reference signal 204 having a given reference frequency. PLL 200 includes a phase detector 206, a loop filter 208, a variable frequency oscillator 210 (e.g., a voltage controlled oscillator or a digitally controlled oscillator), and a fractional divider 212.

In operation, fractional divider 212 generates a comparison signal 214 based on output signal 202. Specifically, fractional divider 212 reduces the frequency of output signal 202 by a fractional division factor N.f, where N is the integer portion and f is the fractional portion of the fractional division factor N.f, to generate comparison signal 214. This reduction in frequency allows output signal 202 to be generated at a desired frequency that is N.f times greater than the frequency of input signal 204. The fractional division factor of fractional divider 212 can be adjusted to adjust the frequency of output signal 202 to a desired value.

Phase detector 206 generates a control signal 218 based on the difference in phase between reference signal 204 and comparison signal 214. In a digital implementation, phase detector 206 can be a time-to-digital converter or a bang-bang phase detector, for example. For a bang-bang phase detector implementation, control signal 218 indicates whether comparison signal 214 is leading or lagging reference signal 204, but generally does not include information as to the magnitude of the difference in phase between reference signal 204 and comparison signal 214.

Loop filter 208 low-pass filters control signal 218 to produce a filtered control signal 220. Filtered control signal 220 is then applied to variable frequency oscillator 210 to correct for any phase error between reference signal 204 and comparison signal 214 to either maintain PLL 200 in a locked state or to bring PLL 200 into a locked state.

One possible implementation of fractional divider 212 is shown in FIG. 2. In particular, fractional divider 212 is shown as being implemented by a multi-modulus divider (MMD) 222 and a modulator 224. In operation, MMD 222 reduces the frequency of output signal 202 using two or more integer division factors to generate comparison signal 214. MMD 222 is specifically controlled by the sum of the output of modulator 224 and an integer word 230 (that represents the integer portion N of the fractional division factor N.f) to alternately select the different integer division factors of MMD 222 in such a way that the frequency of output signal 202 is reduced on average by the fractional division factor N.f.

Modulator 224 can include at least one accumulator (not shown) for causing the integer division factors of MMD 222 to be alternately selected in this way. The accumulator can be clocked by comparison signal 214 and incremented by an amount determined by a fractional word 226 (that represents the fractional portion f of the fractional division factor N.f) with each pulse of comparison signal 214. Assuming MMD 222 is implemented as a dual-modulus divider that reduces the frequency of output signal 202 by either the integer division factor N or N+1, when the accumulator overflows, modulator 224 can use the output or modulator 224 to adjust the integer division factor of MMD 222 to be set to N+1 for one cycle of comparison signal 214 and to the integer division factor N at all other times. One way in which modulator 224 can accomplish this functionality is by setting the output of modulator 224 equal to the carry out of its accumulator.

For example, if the fractional division factor N.f of fractional divider 212 is 5.2, modulator 224 can control MMD 222 to alternately switch between the integer division factors of five and six such that comparison signal 214 has an average frequency that is 5.2 times slower than the frequency of output signal 202. Modulator 224 can specifically control MMD 222 using the output of modulator 224 to use the integer division factor five for four consecutive pulses of comparison signal 214 and then switch to the integer division factor six for the next pulse of comparison signal 214. This integer division factor selection sequence (i.e., 5, 5, 5, 5, 6) can then be repeated thereafter. As can be verified, this integer division factor selection sequence will provide comparison signal 214 with an average frequency that is 5.2 times slower than the frequency of output signal 202.

To control MMD 222 to alternately select between the integer division factors of five and six according to the integer division factor selection sequence noted above, fractional word 226 can be appropriately set. For example, assuming that the modulus of the accumulator a modulator 224 is equal to five, then fractional word 226 can be set equal to one to provide the desired control of MMD 222. Setting the fractional word 226 equal to one means that, for each pulse of comparison signal 214, the accumulator of modulator 224 increments by one and, for every five pulses of comparison signal 214, the accumulator overflows. Thus, setting fractional word 226 to one causes MMD 222 to tae the integer division factor of five for four pulses of comparison signal 214 and then, when the accumulator of modulator 224 overflows on the fifth pulse of comparison signal 214, switch to the integer division factor of six for the fifth pulse of comparison signal 214 as desired.

Figure 3:
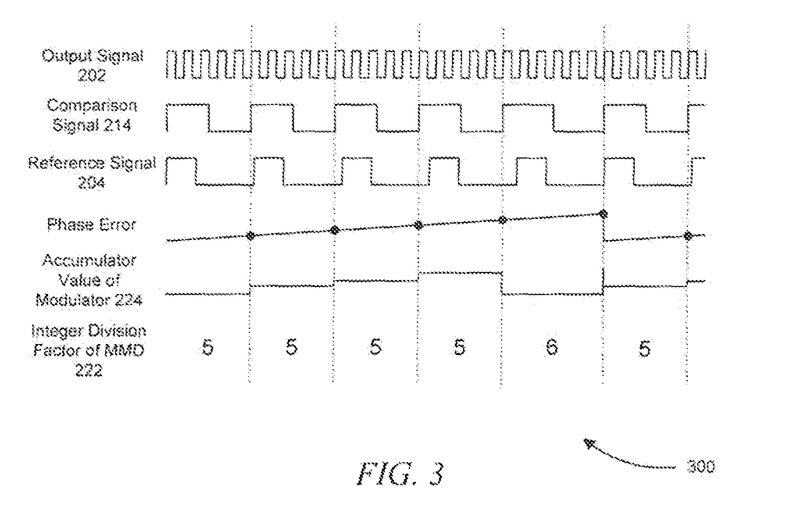
FIG. 3 illustrates a block diagram of an example frequency synthesizer that uses a counter based period error detector to accordance with embodiments of the present disclosure.

FIG. 3 provides a signal waveform 300 that further illustrates the operation of MMD 222 and modulator 224. Signal waveform 300 assumes, for illustration purposes, that the fractional division factor N.f of fractional divider 212 is equal to 5.2, that MMD 222 is a dual-modulus divider with two integer division factors of live and six, and that mode 224 includes as single accumulator with a modulus of five and receives as input a fractional word 226 with a value of one as described above.

As can be seen from signal waveform 300, the use of integer division factors by the MMD 222 that are not exactly equal to the fractional division factor of 5.2 introduces phase noise into comparison signal 214. The phase noise of comparison signal 214 increases during accumulation of fractional word 226 by the accumulator value of modulator 224 and then is reduced back down to zero (in at least this example) when the accumulator overflows. Because of the periodic nature and abrupt changes in the phase noise of the comparison signal 214, spurs can be introduced into the frequency domain of output signal 202 depending on the bandwidth of loop filter 208.

It should be noted that, in other implementations of fractional divider 212, MMD 222 can include more than two division factors and modulator 224 each be implemented as a second-order or higher sigma-delta modulator instead of an accumulator. A second-order or higher sigma-delta modulator combined with an MMD that provides more than two integer division factors can be used to further randomize the integer division factor selection sequence in such a way that the spur causing noise is translated to a higher-frequency that is more easily filtered by loop filter 208.

3. Frequency Multiplier for a PLL with

Figure 4A:
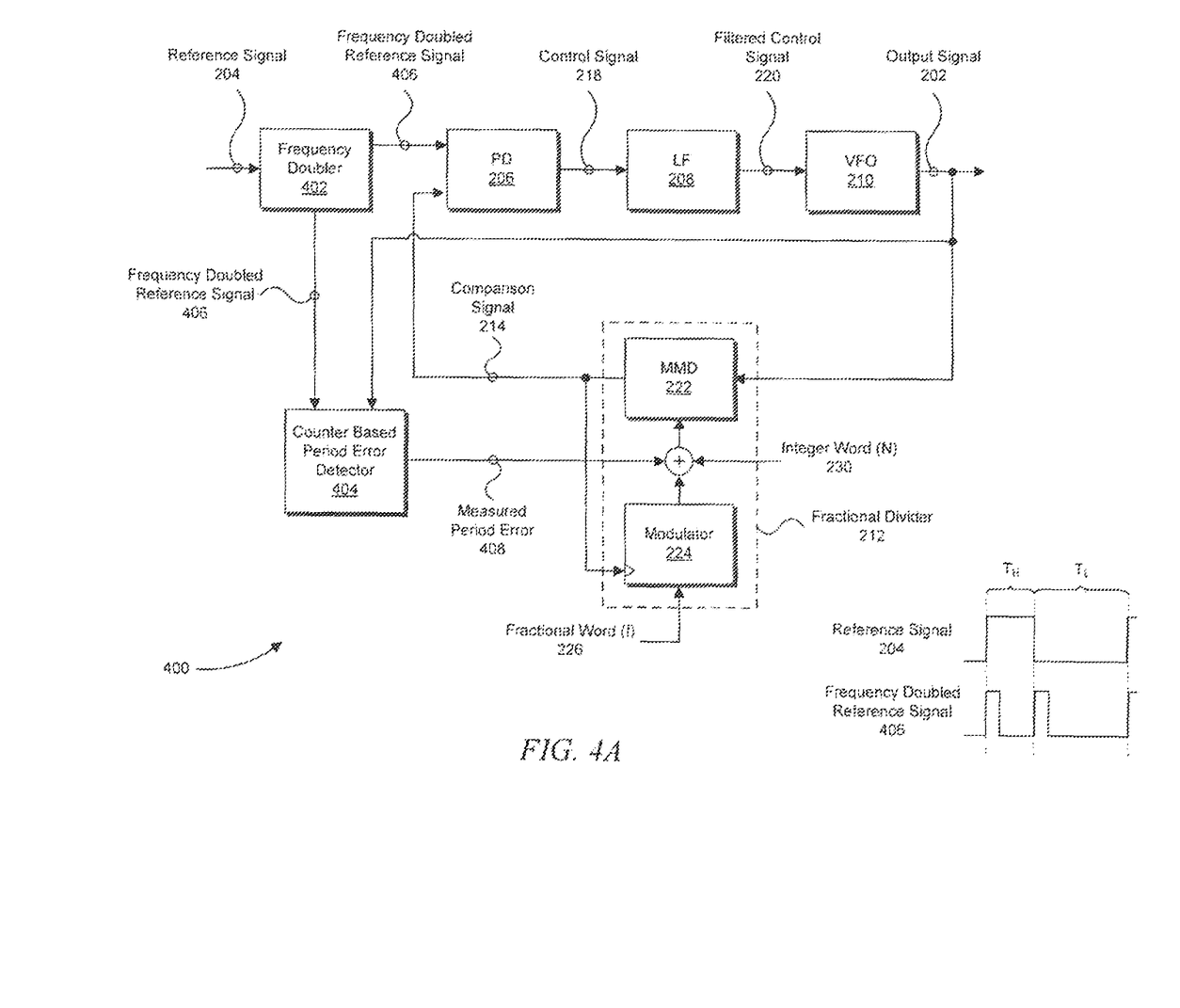
FIG. 4A illustrates a block diagram of an example frequency synthesizer that uses a counter based period error detector in accordance with embodiments of the present disclosure.

Referring now to FIG. 4A, a frequency synthesizer 400 is illustrated in accordance with embodiments of the present disclosure. Frequency synthesizer 400 includes a PLL with the same structure as PLL 200 described above in regard to FIG. 2 as well as a frequency doubler 402 and a counter based period error detector 404.

Frequency doubler 402 is configured to double the frequency of reference signal 204 to provide a frequency doubled reference signal 406. Frequency doubled reference signal 406 allows for a decrease in the fractional division factor N.f of fractional divider 212 and a corresponding decrease in phase noise in output signal 202 from reference signal 204. At the same time, frequency doubted reference signal 406 enables a higher loop bandwidth, which can further reduce phase noise in output signal 202 from variable frequency oscillator 210.

Frequency doubler 402 doubles the frequency of reference signal 204 using a circuit, such as the circuit of frequency doubler 100 in FIG. 1. As discussed above, a conventional frequency doubler uses a duty-cycle correction circuit to correct the duty-cycle of a reference signal, such as reference signal 204, to be 50% before doubling the frequency of the reference signal. The duty-cycle correction circuit is used because, without a 50% duty-cycle reference signal, a frequency doubler will typically produce a frequency doubled version of the reference signal with a constant duty-cycle variation and period variation between adjacent cycles. As a result of these variations, edges (either rising or falling) of the frequency doubled reference signal that are used as reference points by a PLL phase detector to measure phase error in the PLL output signal will deviate from their ideal positions and cause a periodic inaccuracy in the measured phase error.

The problem with duty-cycle correction circuits used by conventional frequency doublers is that they are typically analog solutions, such as variable delay lines with long chains of inverters or buffers, that directly adjust the reference signal. These solutions can considerably increase the noise (e.g., thermal noise and supply noise) of the reference signal, as well as the overall power consumption and cost of the PLL.

Rather than directly correct the duty-cycle of reference signal 204, frequency synthesizer 400 uses counter based period error detector 404 to measure the period error between adjacent cycles of frequency doubled reference signal 406 in terms of cycles of output signal 202 and adjust the fractional division factor N.f of fractional divider 212 to compensate for the measured period error 408.

A waveform diagram is shown to the bottom right of frequency synthesizer 400 in FIG. 4A that illustrates a cycle of reference signal 204 and a corresponding pair of adjacent cycles of frequency doubled reference signal 406. As can be seen from the waveform, the adjacent cycles of frequency doubled reference signal 406 have different periods (i.e., different time durations). Counter based period error detector 404 includes one or more counters that count the respective number of cycles of output signal 202 that occur during each of the adjacent cycles of frequency doubled reference signal 406 (with some quantization error). Because the adjacent cycles of frequency doubled reference signal 406 ideally should have the same period, half the difference between the two count values provides a measure of the period error of each adjacent cycle of the frequency doubled reference signal 406. More specifically, the absolute value of half the difference between the two count values specifies how much the shorter of the two adjacent cycles should be increased by in duration and how much the longer of the two adjacent cycles should be decreased by in duration in order for the two adjacent cycles to have substantially equal periods.

To compensate for the difference in period between the two adjacent cycles, measured period error 408 (equal to the absolute value of half the difference between the two count values) can be used to adjust the division factor of fractional divider 212. In particular, for the shorter of the two adjacent cycles, measured period error 408 can be subtracted from integer word 230 and, for the longer of the two adjacent cycles, measured period error 408 can be added to integer word 230, where integer word 230 represents the integer portion N of the fractional division factor of fractional divider 212, in order to add and subtract measured period error 408 in the manner above, counter based error detector 404 can ping-pong between providing measured period error 408 as a negative and positive value.

By changing the integer portion N of the fractional division factor N.f of fractional divider 212 in this way, the period of comparison signal 214 is effectively being changed or modulated to compensate for the period variation in frequency doubled reference signal 406. As a result, the edges (either rising or falling) of frequency doubled reference signal 406 that are used as reference points by phase detector 206 to measure a difference in phase between comparison signal 214 and frequency doubled reference signal 406, and that deviate from their ideal positions because of the period variation between adjacent cycles of the frequency doubled reference signal 406, will not cause (or at least not to the same extent) a periodic inaccuracy in control signal 218.

It should be noted that, prior to outputting measured period error 408, measured period error 408 can be further gain adjusted by counter based period error detector 404 and/or filtered by counter based period error detector 404 based on previous values of measured period error 408 determined from earlier occurring pairs of adjacent cycles of frequency doubled reference signal 406. For example, counter based period error detector 404 can low-pass filter measure period error 408.

It should be further noted that counter based error detector 404 can alternatively determine the measured period error 408 based on reference signal 204 as opposed to frequency doubled reference signal 406. More specifically, counter based period error detector 404 can use its one or more counters to count the respective number of cycles of output signal 202 that occur during each of the high and low portions of the cycle of reference signal 204 that corresponds to the two adjacent cycles of frequency doubled reference signal 406. As shown in the waveform to the bottom right of frequency synthesizer 400 in FIG. 4A, the high and low portions of the cycle of reference signal 204 can respectively have the same duration as the corresponding two adjacent cycles of frequency doubled reference signal 406. This alternative applies to other embodiments of counter based period error detector 404 shown in the figures discussed below, including counter based period detectors 504 and 604, as well as bang bang based period error detector 702 shown in FIG. 7.

Figure 4B:
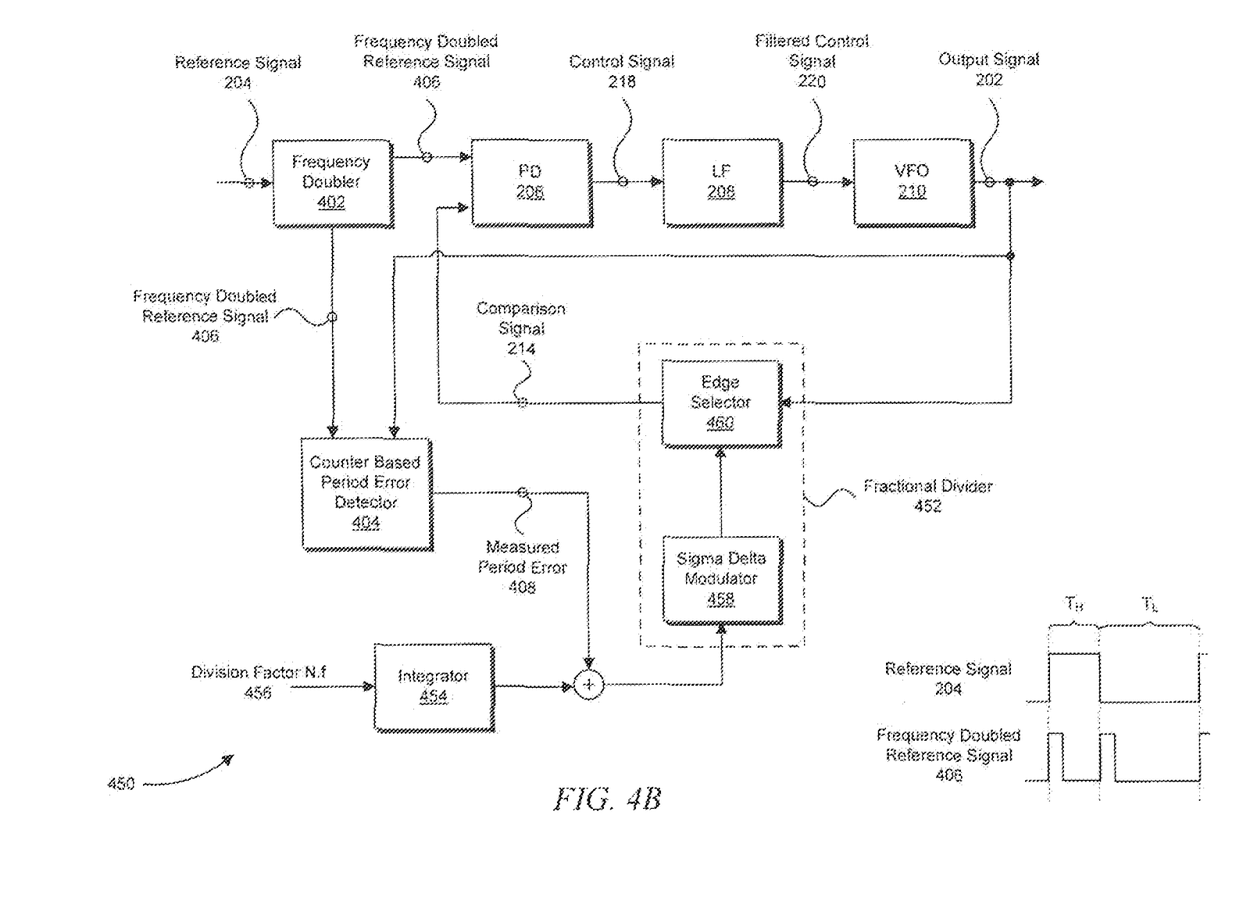
FIG. 4B illustrates a block diagram of an example frequency synthesizer that uses a counter based period error detector with error corrections made in the phase domain in accordance with embodiments of the present disclosure.

Finally, it should be noted that PLL structure 200 used in frequency synthesizer 400 is provided by way of example and not limitation. One of ordinary skill in the art will recognize the other PLL structures can be used with frequency doubler 402 and counter based period error detector 404. For example, in the implementation of fractional divider 212 shown in FIG. 4A, the measured period error 408 is used as a frequency domain correction factor. In other implementations of fractional divider 212, the measured period 408 can be used as a phase domain correction factor as will be appreciated by one of ordinary skill in the art. Such an implementation, is shown in FIG. 4B. In particular, frequency synthesizer 450 has a similar configuration as frequency synthesizer 400 in FIG. 4A, but with the general exception of a modified fractional divider 452 and an additional integrator 454. Integrator 454 integrates the entire division factor N.f 456 and adds the integrated division factor, which is a phase domain value, to measured period error 408. The resulting sum is then used as input to a sigma delta modulator 458. The output of sigma delta modulator 458 is used by edge selector 460 to provide a pulse or cycle of comparison signal 214 with a desired phase value. In general, edge selector 460 can provide a pulse or cycle of comparison signal 214 with any one of a plurality of different phase values as determined by the output of sigma delta modulator 458. It will be appreciated by one of ordinary skill in the art that the fractional dividers of the other frequency synthesizers described below can be similarly modified to operate in the phase domain.

Figure 5:
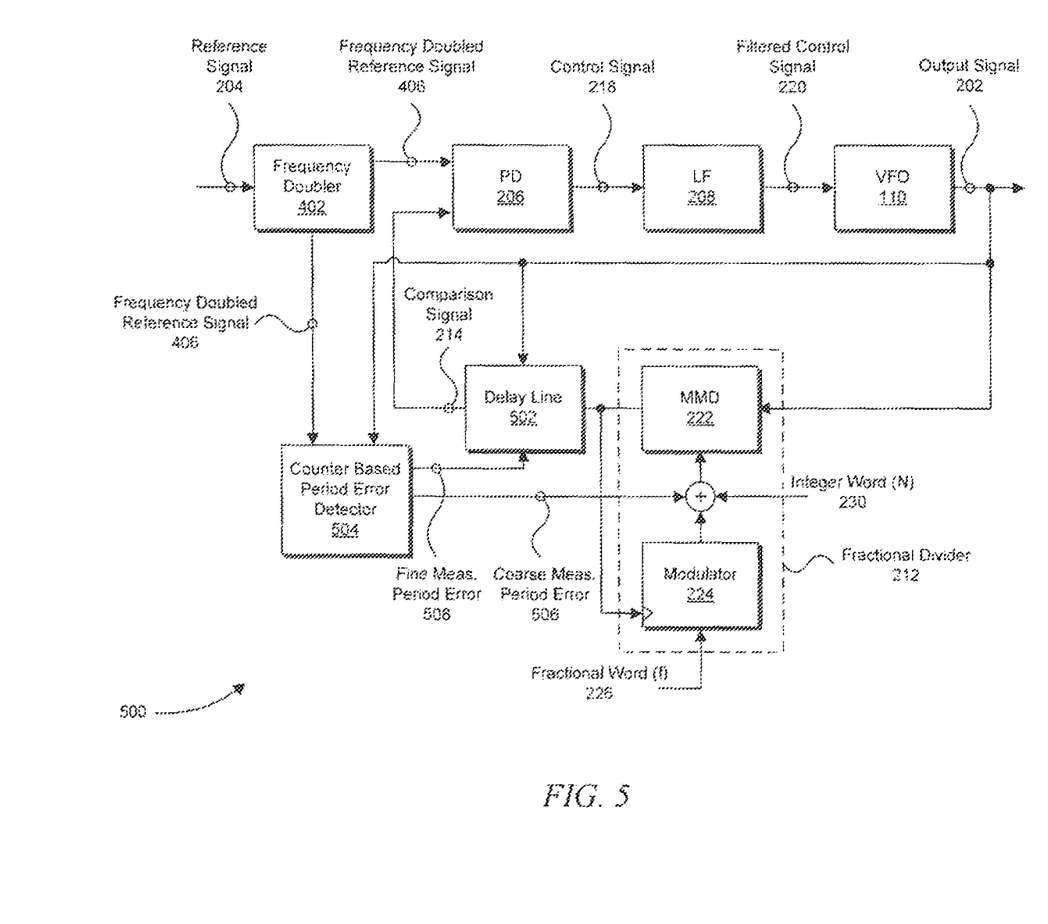
FIG. 5 illustrates a block diagram of an example frequency synthesizer that uses a counter based period error detector and delay line in accordance with embodiments of the present disclosure.

Referring now to FIG. 5, another frequency synthesizer 500 is illustrated in accordance with embodiments of the present disclosure. Frequency synthesizer 500 has a similar structure as frequency synthesizer 400 in FIG. 4A but includes a delay line 502 and a counter based period error detector 504 that has slightly modified functionality from counter based period error detector 404.

Similar to how frequency synthesizer 400 in FIG. 4A uses counter based period error detector 404, frequency synthesizer 500 uses counter based period error detector 504 to measure the period error between adjacent cycles of frequency doubled reference signal 406 and adjust the division factor of fractional divider 212 to compensate for the measured period error 408. However, unlike counter based period error detector 404, which measures the period error between adjacent cycles of frequency doubled reference signal 406 in terms of cycles of output signal 202, counter based period error detector 504 is configured to measure the period error between adjacent cycles of frequency doubled reference signal in terms of a higher frequency clock signal than output signal 202. Using a higher frequency clock can improve the accuracy of the period error measurement by reducing quantization noise.

In the embodiment of FIG. 5, frequency synthesizer 500 is specifically configured to measure the period error between adjacent cycles of frequency doubled reference signal 406 using both rising and falling edges of output signal 202, effectively doubling the frequency of output signal 202.

Counter based period error detector 504 includes one or more counters that count the respective number of rising and falling edges of output signal 202 that occur during each of the adjacent cycles of frequency doubled reference signal 406. Because the adjacent cycles of frequency doubled reference signal 406 ideally should have the same period, half the difference between the two count values provides a measure of the period error of each adjacent cycle in terms of half-cycles of output signal 202. More specifically, the absolute value of half the difference between the two count values specifies much the shorter of the two adjacent cycles should be increased by in duration and how much the longer of the two adjacent cycles should be decreased by in duration in order for the two adjacent cycles to have substantially equal periods.

To compensate for the difference in period between the two adjacent cycles, a coarse measured period error 506 equal to the integer part of the absolute value of the difference between the two count values divided by four and a fine measured period error 508 equal to the fractional part of the absolute value of the difference between the two count values divided by two are provided as output. In particular, coarse measured period error 506 can be used to adjust the division factor of fractional divider 212. For the shorter of the two adjacent cycles, coarse measured period error 506 can be subtracted from integer word 230 and, for the longer of the two adjacent cycles, coarse measured period error 506 can be added to integer word 230, where integer word 230 represents the integer portion N of the fractional division factor N.f of fractional divider 212. In order to add and subtract coarse measured period error 506 in the manner above, counter based error detector 504 can ping-pong between providing coarse measured period error 506 as a negative and positive value.

Fine measured period error 508 can be used to adjust delay line 502 to delay the output of fractional divider 212 by an integer number of half-cycles of output signal 202 determined based on the value of fine measured period error 508. Delay line 502 can be implemented, for example, as a flip-flop based delay line, with the flip-flops clocked by both the rising and falling edges of output signal 202. It other embodiments, delay line 502 can be implemented using, in addition to or as an alternative to flip-flops, inverters and/or buffers. The inverters or buffers can be used to provide for a resolution finer than a half-cycle of output signal 202.

Figure 6:
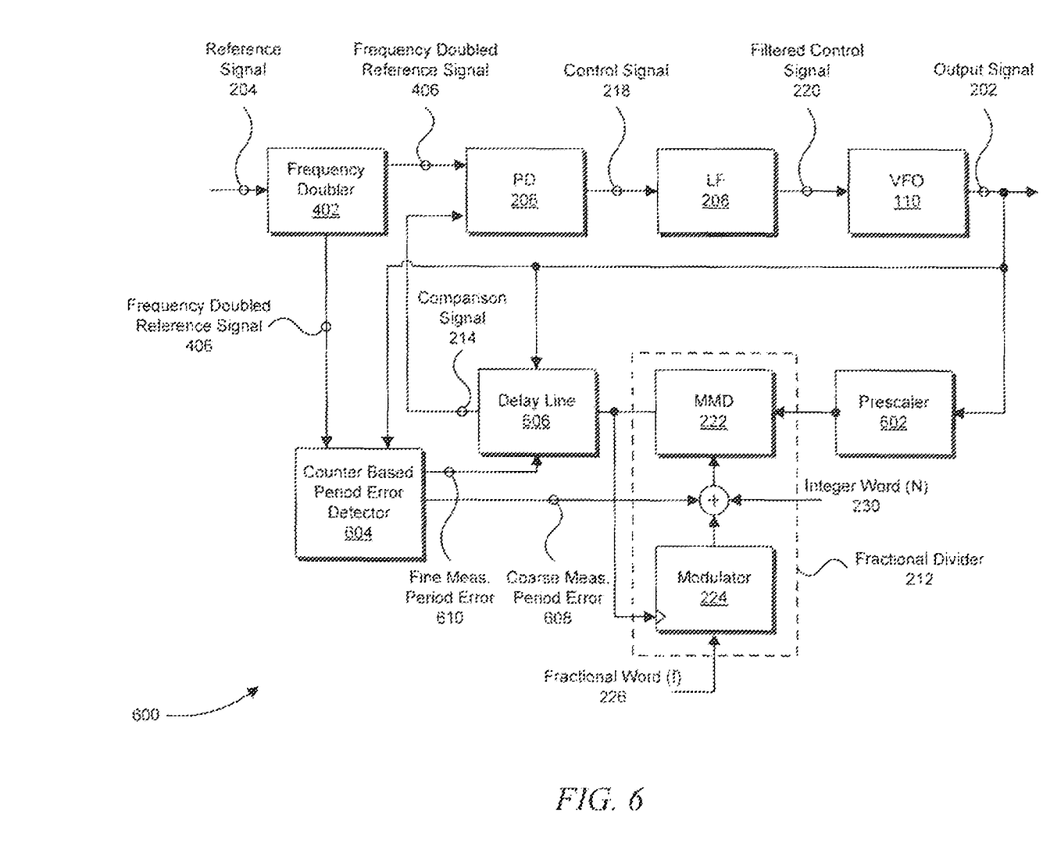
FIG. 6 illustrates a block diagram of an example frequency synthesizer that uses a counter based period error detector, delay line, and prescaler in accordance with embodiments of the present disclosure.

Referring now to FIG. 6, another frequency synthesizer 600 is illustrated in accordance with embodiments of the present disclosure. Frequency synthesizer 600 has a similar structure as frequency synthesizer 400 in FIG. 4A but includes a prescaler 602, a counter based period error detector 604 that has slightly modified functionality from counter based period error detector 404, and a delay line 606.

Prescaler 602 is configured to pre-divide output signal 202 by an integer amount before output signal 202 is processed by fractional divider 212. A prescaler, such as prescaler 602, is typically used to extend the upper frequency range at which a PLL can produce an output signal. Prescaler 602 can pre-divide output signal 202 by a factor of two, four, or eight, for example.

Counter based period error detector 604 is configured to function in the same manner as counter based period error detector 404 described above in FIG. 4A but output a measured period error in a slightly different format to account for the effects of prescaler 602. In particular, counter based period error detector 604 is configured to output a coarse measured period error 608 to adjust the fractional division factor N.f of fractional divider 212. Coarse measured period error 608 is the same as measured period error 408 but divided (or effectively divided) by the division factor used by prescaler 602.

Any resulting remainder of the division can optionally be used as a fine measured period error 610. Fine measured period error 610 can be used to adjust a delay line 606 to delay the output of fractional divider 212 by an integer number of cycles of output signal 202 determined based on the value of fine measured period error 610 to provide comparison signal 214. Delay line 606 can be implemented, for example, as a flip-flop based delay line, with the flip-flops clocked by output signal 202. In other embodiments, delay line 606 can be implemented using, in addition to or as an alternative to flip-flops, inverters and/or buffers that can provide for a finer resolution.

Counter based error detector 604 can ping-pong between providing coarse measured period error 508 as a negative and positive value in a similar manner that counter based error detector 404 in FIG. 4A provides measured period error 408.

Figure 7:
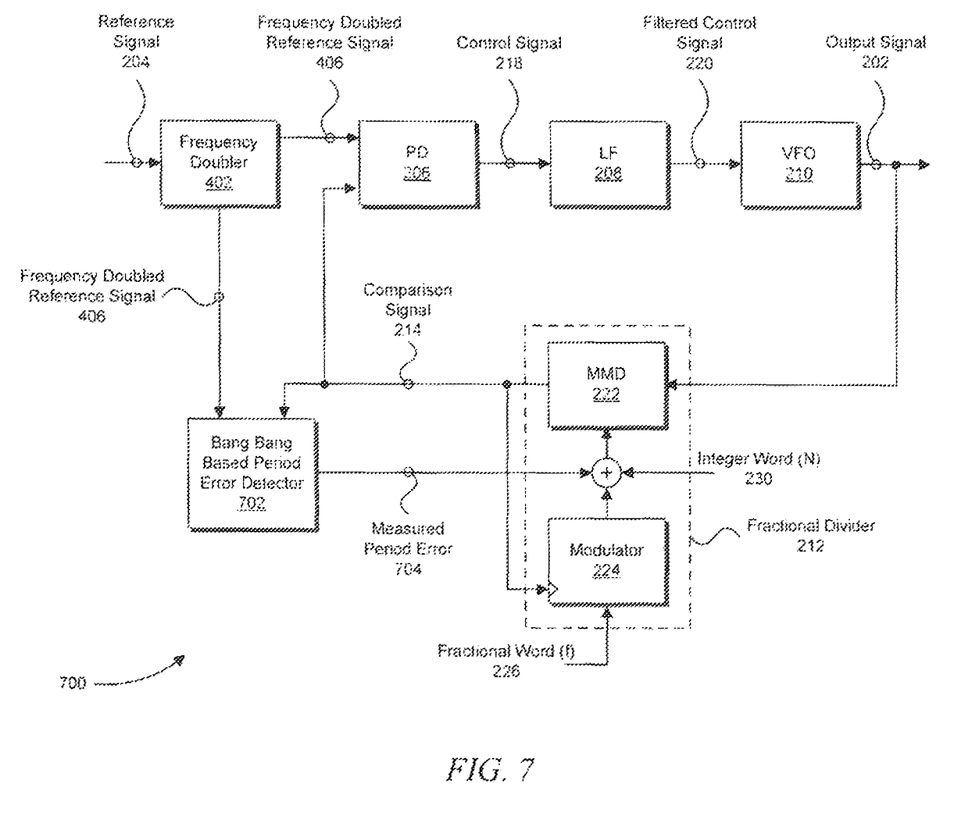
FIG. 7 illustrates a block diagram of an example bang bang phase detector in accordance with embodiments the present disclosure.

Referring now to FIG. 7, another frequency synthesizer 700 is illustrated in accordance with embodiments of the present disclosure. Frequency synthesizer 700 has a similar structure as frequency synthesizer 400 in FIG. 4A but includes a bang bang based period error detector 702 as opposed to a counter based period error detector.

Bang bang based period error detector 702 is configured to measure the period error between adjacent cycles of frequency doubled reference signal 406 in terms of cycles of output signal 202 and adjust the division factor of fractional divider 212 to compensate for the measured period error 704. Bang bang based period error detector 702 includes a bang bang phase detector (BBPD) that compares the phase of frequency doubled reference signal 406 to the phase of comparison signal 214 and provides an output (e.g., a one-bit output) that indicates whether a cycle of the frequency doubled reference signal leads or lags a corresponding cycle of comparison signal 214 in phase. Bang bang based period error detector 702 integrates the output of the BBPD and uses the integrated value as a measured period error 704 (i.e., a measure of the period error between adjacent cycles of frequency doubled reference signal 406 in terms of cycles of output signal 202). The integration can also include other forms of filtering and gain adjustment.

Before integrating the output of the BBPD, the output can be effectively "normalized" based on whether the output of the BBPD was generated for the shorter or the longer of the two adjacent cycles of frequency doubled reference signal 406. For example, and in one embodiment, the output of the BBPD can be multiplied by +1 if the output of the BBPD was generated for the shorter of the two adjacent cycles of frequency doubled reference signal 406 and multiplied by −1 if the output of the BBPD was generated for the longer of two adjacent cycles of frequency doubled reference signal 406.

To compensate for the difference in period between the two adjacent cycles, measured period error 704 can be used in adjust the fractional division factor N.f of fractional divider 212. In particular, for the shorter of the two adjacent cycles, measured period error 704 can be subtracted from integer word 230 and, for the longer of the two adjacent cycles, measured period error 704 can be added to integer word 230, where integer word 230 represents the integer portion N of the fractional division factor of fractional divider 212. In order to add and subtract measured period error 704 in the manner above, bang bang based error detector 702 can ping-pong between providing measured period error 704 as a negative and positive value.

It should be noted that, in a PLL implementation where PD 206 is implemented as a BBPD, bang bang based period error detector 702 can be implemented without its own BBPD and use the output of PD 206 instead as would be appreciated by one of ordinary skill in the art based on the teachings herein.

It should be noted that the frequency synthesizers illustrated in FIGS. 4-7 and described above all use a frequency doubler to increase the frequency of the reference signal to a PLL. As will be appreciated by one of ordinary skill in the art based on the teachings herein, the embodiments of the apparatus and method of the present disclosure described above can be readily extended and used in frequency synthesizers that increase the frequency of the reference signal by more than a factor of two. In such instances, the counter based period error detector or bang bang based error detector can determine the relative period errors between adjacent cycles of the increased frequency reference signal and similarly adjust the division factor of the PLL divider to compensate for any variations.

4. Conclusion

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

What is claimed is:

1. A frequency synthesizer, comprising:
   a frequency multiplier configured to multiply a frequency of a reference signal to produce an increased frequency reference signal;
   a phase-locked loop (PLL) comprising a variable frequency oscillator configured to provide an output signal, a divider configured to reduce a frequency of the output signal based on a division factor to produce a comparison signal, and a phase detector configured to determine a difference or phase between the increased frequency reference signal and the comparison signal and adjust the variable frequency oscillator based on the difference in phase; and
   a period error detector configured to measure a period error between a first cycle of the increased frequency reference signal and a second cycle of the increased frequency reference signal and adjust the division factor based on the measured period error.

2. The frequency synthesizer of claim 1, wherein the period error detector is further configured to count a number of cycles of the output signal that occur during the first cycle of the increased frequency reference signal and a number of cycles of the output signal that occur during the second cycle of the increased frequency reference signal.

3. The frequency synthesizer of claim 2, wherein the period error detector is further configured to determine a difference between the number of cycles of the output signal that occur during the first cycle of the increased frequency reference signal and the number of cycles of the output signal that occur during the second cycle of the increased frequency reference signal.

4. The frequency synthesizer of claim 3, wherein the period error detector is configured to determine the measured period error to be equal to one half the difference between the number of cycles of the output signal that occur during the first cycle of the increased frequency reference signal and the number of cycles of the output signal that occur during the second cycle of the increased frequency reference signal.

5. The frequency synthesizer of claim 4, wherein the measured period error is added to the division factor to compensate for a first part of the period error associated with the first cycle of the increased frequency reference signal and subtracted from the division factor to compensate for a second part of the period error associated with the second cycle of the increased frequency reference signal.

6. The frequency synthesizer of claim 1, wherein the measured period error is filtered before being used to adjust the division factor.

7. The frequency synthesizer of claim 1, wherein the PLL further comprises a prescaler configured to reduce the frequency of the output signal before the output signal is processed by the frequency divider.

8. The frequency synthesizer of claim 7, further comprising a delay line configured to delay the comparison signal by an integer number of cycles of the output signal.

9. The frequency synthesizer of claim 8, wherein the period error detector is further configured to adjust the delay line based on the measured period error.

10. The frequency synthesizer of claim 1, wherein the period error detector is further configured to generate a first one-bit indication based on whether the first cycle of the increased frequency reference signal is leading or lagging the comparison signal in phase and a second one-bit indication based on whether the second cycle of the increased frequency reference signal is leading or lagging the comparison signal in phase.

11. The frequency synthesizer of claim 10, wherein the measured period error is determined by integrating the first one-bit indication and the second one-bit indication.

12. A frequency synthesizer, comprising:
a frequency doubler configured to double a frequency of a reference signal to produce a frequency doubled reference signal;
a phase-locked loop (PLL) comprising a variable frequency oscillator configured to provide an output signal, a frequency divider configured to reduce a frequency of the output signal based on a division factor to produce a comparison signal, and a phase detector configured to determine a difference in phase between the frequency doubled reference signal and the comparison signal and adjust the variable frequency oscillator based on the difference in phase; and
a period error detector configured to:
measure a period error between a first cycle of the frequency doubled reference signal and a second cycle of the frequency doubled reference signal based on a difference between a number of cycles of the output signal that occur during the first cycle of the frequency doubled reference signal and a number of cycles of the output signal that occur during the second cycle of the frequency doubled reference signal, and
adjust the division factor based on the measured period error.

13. The frequency synthesizer of claim 12, wherein the period error detector is configured to determine the measured period error to be equal to one half the difference between the number of cycles of the output signal that occur during the first cycle of the frequency doubled reference signal and the number of cycles of the output signal that occur during the second cycle of the frequency doubled reference signal.

14. The frequency synthesizer of claim 13, wherein the measured period error is added to the division factor to compensate for the period error associated with the first cycle of the frequency doubled reference signal and subtracted from the division factor to compensate for a period error associated with the second cycle of the increased frequency reference signal.

15. The frequency synthesizer of claim 12, wherein the measured period error is filtered before being used to adjust the division factor.

16. The frequency synthesizer of claim 12, wherein the PLL further comprises a prescaler configured to reduce the frequency of the output signal before the output signal is processed by the frequency divider.

17. The frequency synthesizer of claim 16, further comprising a delay line configured to delay the comparison signal by an integer number of cycles of the output signal.

18. The frequency synthesizer of claim 17, wherein the period error detector is further configured to adjust the delay line based on the measured period error.

19. The frequency synthesizer of claim 12, further comprising a delay line configured to delay the comparison signal by an integer number of half-cycles of the output signal.

20. A frequency synthesizer, comprising:
a frequency doubler configured to double a frequency of a reference signal to produce a frequency doubled reference signal;
a phase-locked loop (PLL) comprising a variable frequency oscillator configured to provide an output signal, a frequency divider configured to reduce a frequency of the output signal based on a division factor to produce a comparison signal, and a phase detector configured to detect a difference in phase between the frequency doubled reference signal and the comparison signal and adjust the variable frequency oscillator based on the difference in phase; and
a period error sense circuit configured to:
generate a first one-bit indication based on whether a first cycle of the increased frequency reference signal is leading or lagging the comparison signal in phase,
generate a second one-bit indication based on whether the second cycle of the increased frequency reference signal is leading or lagging the comparison signal in phase, and
adjust the division factor based on a measured period error determined by integrating the first one-bit indication and the second one-bit indication.

* * * * *

UNITED STATES PATENT AND TRADEMARK OFFICE
CERTIFICATE OF CORRECTION

| | |
|---|---|
| PATENT NO. | : 9,553,714 B2 |
| APPLICATION NO. | : 14/871202 |
| DATED | : January 24, 2017 |
| INVENTOR(S) | : Ahmad et al. |

It is certified that error appears in the above-identified patent and that said Letters Patent is hereby corrected as shown below:

In the Claims

Column 12 Line 57, replace "determine a difference or phase between the increased" with --determine a difference in phase between the increased--.

Signed and Sealed this
Eleventh Day of June, 2019

Andrei Iancu
*Director of the United States Patent and Trademark Office*